United States Patent
Cheng et al.

(10) Patent No.: US 9,437,675 B1
(45) Date of Patent: Sep. 6, 2016

(54) EDRAM FOR PLANAR III-V SEMICONDUCTOR DEVICES

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/738,073

(22) Filed: Jun. 12, 2015

(51) Int. Cl.
  *H01L 29/06* (2006.01)
  *H01L 27/10* (2006.01)
  *H01L 29/20* (2006.01)
  *H01L 27/108* (2006.01)

(52) U.S. Cl.
  CPC ....... *H01L 29/0649* (2013.01); *H01L 27/1082* (2013.01); *H01L 27/10858* (2013.01); *H01L 27/10873* (2013.01); *H01L 29/20* (2013.01)

(58) Field of Classification Search
  CPC ............... H01L 29/0649; H01L 29/20; H01L 27/1082; H01L 27/10858; H01L 27/10873
  See application file for complete search history.

(56) References Cited

U.S. PATENT DOCUMENTS

| | | |
|---|---|---|
| 5,717,628 A | 2/1998 | Hammerl et al. |
| 6,238,967 B1 | 5/2001 | Shiho et al. |
| 7,078,756 B2 | 7/2006 | Otani et al. |
| 7,915,645 B2 | 3/2011 | Briere |
| 8,008,160 B2 | 8/2011 | Cheng et al. |
| 8,609,517 B2 | 12/2013 | Wann et al. |
| 9,263,453 B1 * | 2/2016 | Cheng ............... H01L 27/10829 |
| 2011/0180862 A1 | 7/2011 | Anderson et al. |
| 2012/0171827 A1 | 7/2012 | Pei et al. |
| 2013/0309830 A1 | 11/2013 | Guo et al. |
| 2014/0001519 A1 | 1/2014 | Dewey et al. |
| 2014/0191286 A1 | 7/2014 | Adam et al. |

OTHER PUBLICATIONS

R. E. Matick et al., "Logic-based eDRAM: Origins and rationale for use," IBM J. Res. & Dev., vol. 49, No. 1, 2005, pp. 145-165.

* cited by examiner

*Primary Examiner* — Whitney T Moore
(74) *Attorney, Agent, or Firm* — Daniel P. Morris; Otterstedt, Ellenbogen & Kammer, LLP

(57) ABSTRACT

Electronic devices including eDRAM structures are formed with a semi-insulating III-V semiconductor layer that suppresses parasitic leakage between the eDRAM transistor and the buried plate of an operatively associated trench capacitor. A low bandgap III-V semiconductor layer is used to form the buried plate.

20 Claims, 3 Drawing Sheets

EDRAM FOR PLANAR III-V SEMICONDUCTOR DEVICES

FIELD

The present disclosure relates to the physical sciences, and, more particularly, to III-V devices including embedded capacitor-based dynamic random access memories and field effect transistors associated therewith, and methods of fabrication thereof.

BACKGROUND

Embedded dynamic random access memories (eDRAMs) are employed in devices such as power processors and application specific integrated circuits (ASICs). Arrays of such memories are fabricated with operatively associated field effect transistors (FETs) using CMOS technology. Various approaches have been proposed for reducing parasitic leakage in devices incorporating eDRAMs. For example, some silicon-based devices include thick oxide linings or collars on the top portions of the trench capacitors to suppress parasitic leakage.

A trench capacitor is a three dimensional device formed by etching a trench into a semiconductor substrate. A node dielectric layer is formed on the inner walls of the trench. The trench is then filled with an electrically conductive material such as metal or highly doped polycrystalline silicon. N-type polysilicon within the trench can function as one electrode of the trench capacitor while an n-doped region surrounding the lower portion of the trench functions as the second electrode thereof. A transistor can be formed above and in electrical communication with the trench capacitor.

III-V compounds offer a number of advantages over silicon with respect to the operation of semiconductor devices. Compound III-V field effect transistors are among the devices that have benefitted from III-V CMOS technology.

SUMMARY

Principles of the present disclosure provide an exemplary fabrication method that includes obtaining a structure including a substrate, a first III-V semiconductor layer on the substrate, the first III-V semiconductor layer including a low bandgap layer, and a semi-insulating III-V semiconductor layer on the first III-V semiconductor layer. A plurality of first field effect transistors is formed on a first region of the semi-insulating III-V semiconductor layer, each of the first field effect transistors including a channel region containing III-V material. A plurality of second field effect transistors is formed on a second region of the semi-insulating III-V semiconductor layer. The method further includes forming a plurality of trench capacitors extending through the second region of the semi-insulating III-V semiconductor layer and within the low bandgap layer of the first III-V semiconductor layer such that each of the trench capacitors is in electrical communication with at least one of the second field effect transistors.

An exemplary eDRAM structure includes a substrate and a first III-V semiconductor layer on the substrate, the first III-V semiconductor layer including a low bandgap layer. A semi-insulating III-V semiconductor layer is on the first III-V semiconductor layer. A plurality of first field effect transistors is on a first region of the semi-insulating III-V semiconductor layer, each of the first field effect transistors including a channel region containing III-V material. The structure further includes a plurality of second field effect transistors on a second region of the semi-insulating III-V semiconductor layer. A plurality of trench capacitors extends through the second region of the semi-insulating III-V semiconductor layer and within the low bandgap layer of the first III-V semiconductor layer. Each of the trench capacitors includes a buried plate comprised of the low bandgap layer of the first III-V semiconductor layer, a capacitor electrode, and a dielectric layer between the buried plate and capacitor electrode. Each of the capacitor electrodes is in electrical communication with at least one of the second field effect transistors. The semi-insulating III-V semiconductor layer is operable to suppress parasitic leakage between each of the second field effect transistors and each of the buried plates.

A further eDRAM structure includes a substrate, a first III-V semiconductor layer on the substrate, the first III-V semiconductor layer including a low bandgap layer, and a semi-insulating III-V semiconductor layer on the first III-V semiconductor layer. An eDRAM structure including a trench capacitor extends through the semi-insulating III-V semiconductor layer and within the low bandgap layer of the first III-V semiconductor layer. The eDRAM structure further includes a field effect transistor on the semi-insulating III-V semiconductor layer. The trench capacitor includes a buried plate comprised of the low bandgap layer of the first III-V semiconductor layer, a capacitor electrode, and a dielectric layer between the buried plate and capacitor electrode. The capacitor electrode is in electrical communication with the field effect transistor. The semi-insulating III-V semiconductor layer is operable to suppress parasitic leakage between the field effect transistor and the buried plate. An electrically conductive contact extends through the semi-insulating III-V semiconductor layer and electrically communicates with the buried plate.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

eDRAM structures and fabrication methods as disclosed herein can provide substantial beneficial technical effects. For example, one or more embodiments may provide one or more of the following advantages:

Integration of eDRAM into III-V structures without the need for separate silicon regions;
  Performance advantages compared to silicon-based devices;
  Formation of electrically insulating collars on the top portions of trench capacitors unnecessary.

These and other features and advantages will become apparent from the following detailed description of illustrative embodiments thereof, which is to be read in connection with the accompanying drawings.

DETAILED DESCRIPTION

Electronic devices including memory devices in the form of trench capacitors and operatively associated field effect transistors are disclosed herein. The electronic devices further include regions including field-effect transistors that are electrically isolated from the memory devices. III-V compound semiconductor materials are employed for forming the trench capacitors and the field effect transistors.

Figure 1:
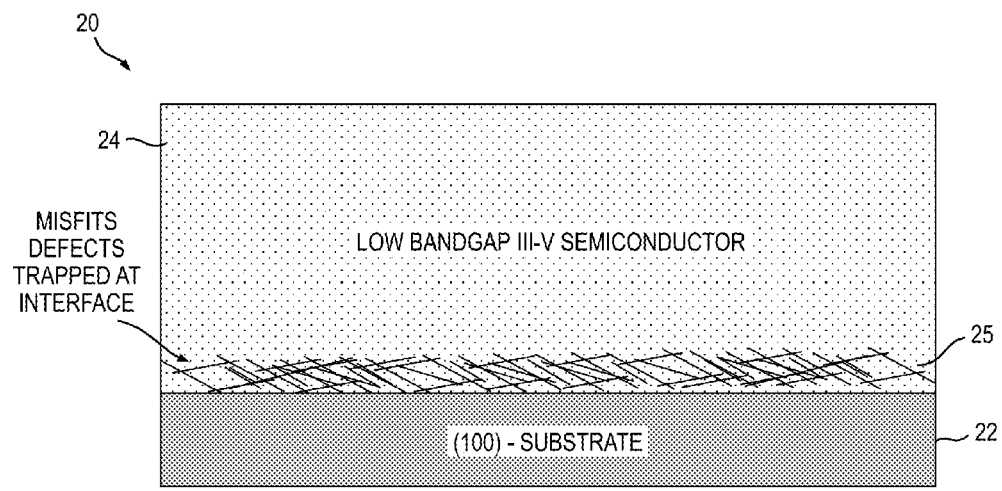
FIG. 1 is a schematic sectional view of a low bandgap III-V semiconductor layer on a silicon substrate.

Referring to FIG. 1, a semiconductor structure 20 includes a crystalline semiconductor substrate 22. A bulk silicon wafer is employed as the substrate in some embodiments. The substrate consists essentially of mono-crystalline silicon in one or more embodiments. Other semiconductor substrates may alternatively be employed such as germanium on silicon substrates and III-V substrates. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. In a silicon-containing substrate, examples of n-type dopants, i.e., impurities, include but are not limited to antimony, arsenic and phosphorous. Silicon and tellurium are n-type dopants in III-V semiconductor materials. Single crystal silicon wafers are commercially available and are characterized by a diamond cube lattice structure. As known in the art, the Miller indices of a substrate are determined from the reciprocals of the points at which the crystal plane of silicon intersects the principle crystalline axes. While some exemplary embodiments relate to structures including doped or undoped (100) silicon as a substrate material, it will be appreciated that the principles expressed are applicable to other semiconductor substrates and substrates with crystallographic orientations other than (100) on which III-V semiconductor materials can be epitaxially grown, including off-axis silicon substrates.

A blanket layer 24 of III-V semiconductor material is epitaxially grown directly on the top surface of the substrate 22. A low bandgap III-V semiconductor material forms all or part of the blanket layer 24. As discussed further below, trenches used for trench capacitors are formed in the low bandgap III-V semiconductor material. Low bandgap materials typically refer to semiconductor materials having bandgaps around or less than one eV. The blanket layer 24 can include one or more layers, with different III-V semiconductor materials grown on each other. The blanket layer is a graded III-V layer in some embodiments. Exemplary low bandgap III-V semiconductor materials forming the blanket layer 24 include but are not limited to $In_{0.53}Ga_{0.47}As$ and InAs. In some embodiments, the low bandgap semiconductor portion of the blanket layer 24 is grown on a buffer layer to accommodate lattice mismatch. For example, gallium arsenide (GaAs), indium phosphide (InP) and doped indium gallium arsenide (InGaAs) are grown in order on the substrate 20 in some embodiments, forming the blanket layer 24. The buffer layer, which includes the GaAs and InP layers in an exemplary embodiment, is between 300 nm and 5000 nm thick.

The surface of the substrate 22 is cleaned if required to remove materials such as oxides that may be present prior to growth of the III-V layer thereon. Various processes are familiar to those of skill in the art for growing III-V semiconductor materials on silicon substrates. Such processes include metalorganic chemical vapor deposition (MOCVD) and molecular beam epitaxy (MBE). Different III-V compounds could be grown on the substrate 22, such as when multiple III-V layers are formed thereon, and accordingly multiple precursors could be used. Depending on which III-V material(s) is to be grown and which precursor is used, different parameters (temperature, process pressure, times, etc.) are applicable. Exemplary metalorganic precursors for one or more of the III-V semiconductor layers used to form the blanket layer 24 and/or other III-V semiconductor layers described further below include Trimethylgallium, Trimethylaluminum, Trimethylindium, Trimethylantimony, Tertiarybutylarsine and Tertiarybutylphosphine. Alternate Group V precursors include arsine and phosphine. Depending which Group V source is used, process temperature, gas flow, pressure and times vary significantly. Process parameters for growing III-V semiconductor materials on silicon and on other III-V semiconductor materials are well known in the art and new methods continue to be developed.

The deposited III-V layer 24 that directly contacts the top surface 22 of the substrate 20 may include misfit defects 25 near the interface with the top surface of the substrate 20 and threading dislocations that propagate towards the surface of the III-V layer. Dislocation density of the layer 24 is in the range of $10^6$-$10^9$ cm$^{-2}$ in some embodiments. In one or more embodiments, the layer 24 has a thickness between 500 nm and 5 μm. The thickness of the blanket layer 24 can be greater to accommodate deeper trench capacitors. As discussed above, the layer 24 may in fact consist of multiple III-V semiconductor layers, in which case the bottom III-V semiconductor layer that directly contacts the top surface of the substrate 22 would include misfit defects 25 caused by the lattice mismatch with the substrate 22 while the threading dislocations extend within the succeeding III-V semiconductor layer(s).

In situ doping may be provided during deposition of at least the low bandgap portion of the blanket layer 24 in which trenches (not shown in FIG. 1) are later formed. Such doping allows the blanket layer to be employed as the buried plate of trench capacitor(s). In some embodiments, tellurium (Te) is employed as the dopant to form an n-type blanket layer. A tellurium doping level between $1\times10^{18}$ cm$^{-3}$ to $5\times10^{18}$ cm$^{-3}$ is employed in one or more embodiments. Silicon and germanium are other n-type dopants that may be employed in some embodiments. Silane is an exemplary precursor that can be employed in combination with the III-V precursors identified above to form n-type III-V semiconductor material.

Figure 2:
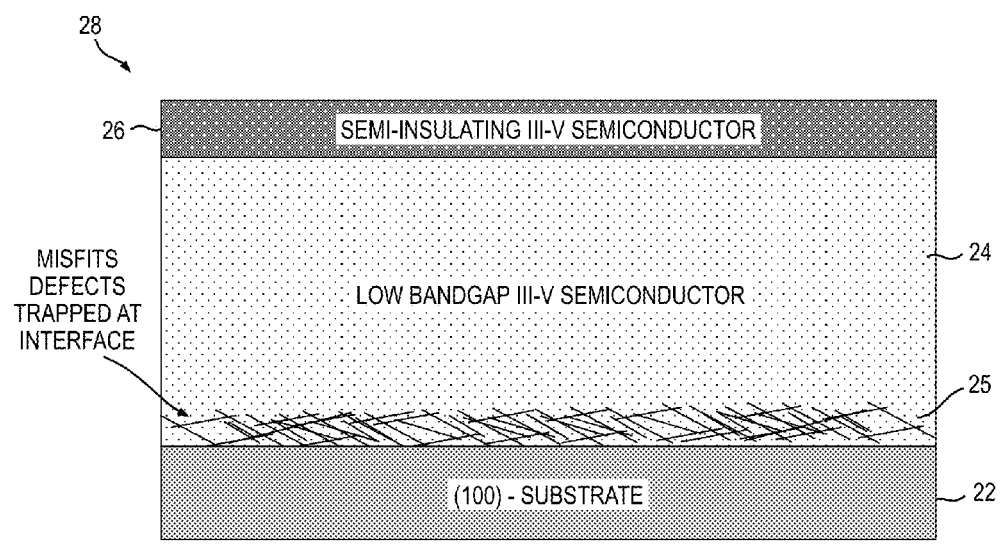
FIG. 2 is a sectional view showing a semi-insulating III-V semiconductor layer grown on the low bandgap III-V semiconductor layer.

A semi-insulating III-V layer 26 is grown on the blanket layer 24 as shown in FIG. 2. Exemplary high-resistivity materials for this layer include InP:Fe and $In_{1-x}Al_xAs$. Undoped indium aluminum arsenide with a stoichiometry of $In_{0.52}Al_{0.48}As$ is used in some embodiments. The thickness of the semi-insulating III-V layer 26 is between one hundred nanometers (100 nm) to one (1) micrometer in some embodiments. As InAlAs has substantially the same lattice constant as $In_{0.53}Ga_{0.47}As$, these two III-V materials are employed for forming the semi-insulating layer 26 and the low bandgap III-V semiconductor layer 24, respectively, in some embodiments. A multilayer substrate 28 as shown in FIG. 2 is accordingly provided in which one or more regions of the substrate can be employed for forming memory devices and other region(s) thereof can be employed for forming arrays of high performance field effect transistors. Back-end-of-line (BEOL) processing would then be employed to complete integrated circuits.

Figure 3:
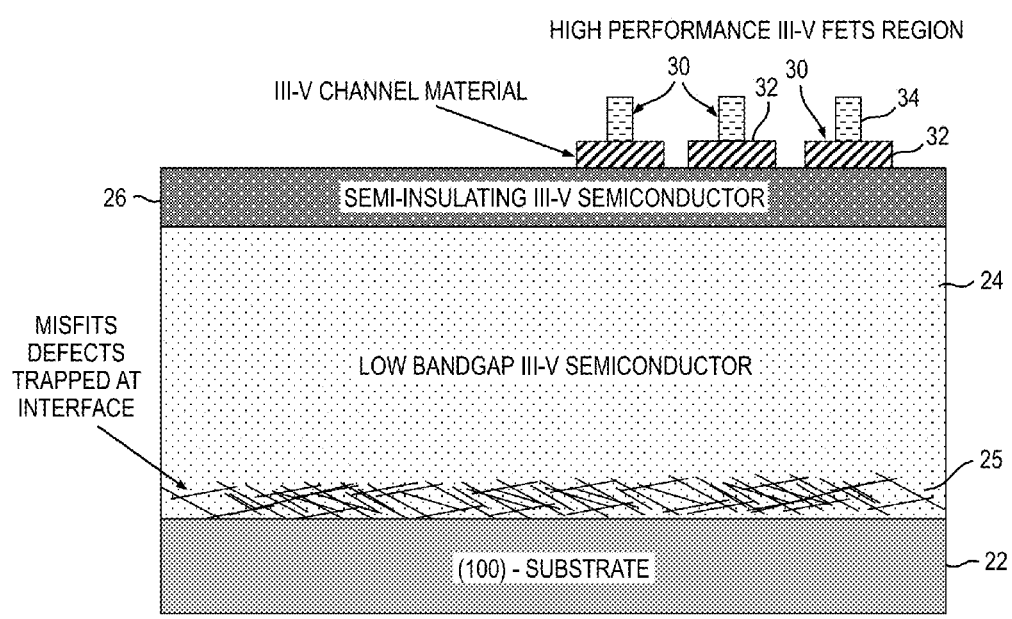
FIG. 3 is a sectional view showing field effect transistors formed on a first region of the semi-insulating III-V semiconductor layer.

Referring to FIG. 3, an array of III-V field effect transistors 30 is formed on a first region of the substrate 28. A layer of III-V channel material is epitaxially formed on the semi-insulating layer 26 and patterned to form the channel regions 32 of the FETs 30. Gate stacks 34 are formed on the channel regions 32 by forming a layer of gate dielectric material and an overlying layer of gate metal. Any suitable deposition technique can be used to deposit high-k dielectric material, including but not limited to atomic layer deposition, chemical vapor deposition, physical vapor deposition, and sputtering. The layers employed to form the gate stacks 34 are patterned using conventional CMOS techniques to obtain the structures as schematically illustrated. Dielectric sidewall spacers (not shown) are formed on the side walls of the gate stacks 34. A dielectric material such as silicon nitride is used to form the spacers in some embodiments. Conventional deposition techniques such as spin-on coating, CVD, plasma-assisted CVD, or other known techniques can be employed to deposit silicon nitride ($Si_3N_4$). Patterning and suitable etching techniques such as reactive ion etching (RIE) can be employed to form the sidewall spacers from the deposited material. Source/drain regions can be formed by ion implantation of the layer of III-V channel material in some embodiments followed by an activation anneal. Exemplary elements for the formation of nFETs include silicon, germanium, sulfur and selenium. Carbon, magnesium and zinc are among the elements that may be employed to form pFETs from III-V semiconductor channel materials such as gallium arsenide. Diffusion is a further technique for forming source/drain regions. It will be appreciated that raised source/drain regions (not shown) can be selectively grown on the III-V channel material in further embodiments following gate stack formation.

Figure 4:
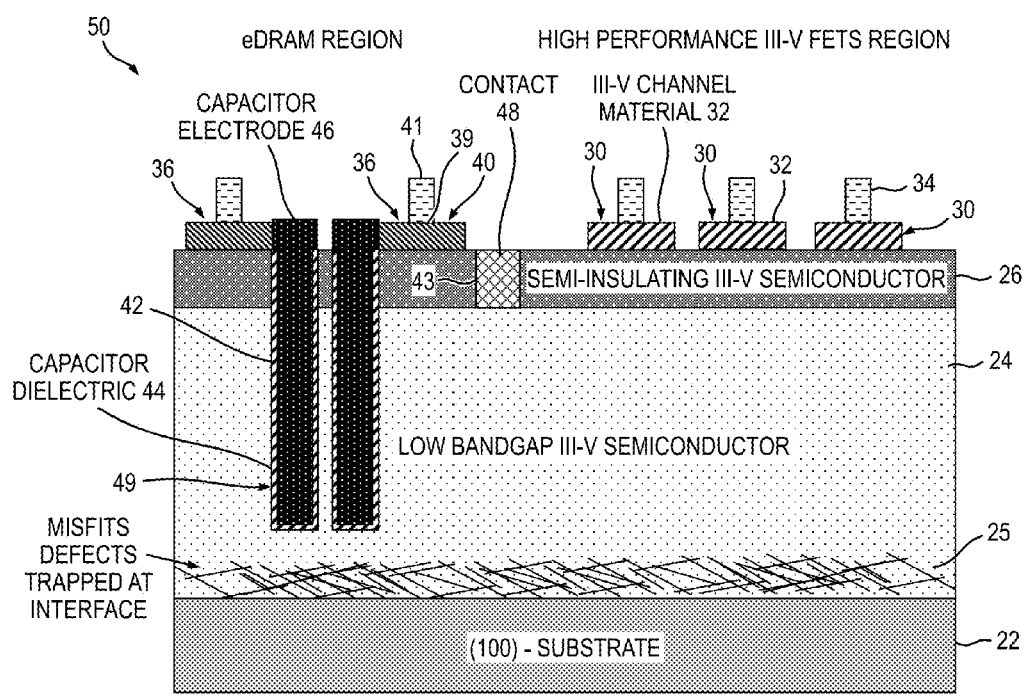
FIG. 4 is a sectional view thereof showing eDRAM structures formed on a second region of the substrate.

A second region(s) of the multilayer substrate 28 is employed to form eDRAM devices. An exemplary second region is identified as the eDRAM Region in FIG. 4. The eDRAM region includes an array of eDRAM devices 36 which may be formed prior or subsequent to the formation of the FETs 30 in the first region of the multilayer substrate 28. Each eDRAM device includes a trench capacitor 49 operatively associated with a FET 40. The trench capacitors 49 are formed in the substrate 28 followed by formation of the FETs 40. The III-V channel material used for forming the FETs 30 in the High Performance III-V FETs Region may or may not be the same channel material 39 as used to form the FETs 40 in the eDRAM Region. The gate stacks 41 of the FETs 40 also may or may not be the same as the gate stacks formed in the High Performance III-V FETs Region.

The FETs 40 are formed in the eDRAM region using conventional CMOS techniques as described above with respect to the FETs 30. The trenches 42 for the trench capacitors 38 are formed through the semi-insulating III-V semiconductor layer 26 and terminate within the III-V blanket layer 24. In embodiments where the blanket layer includes a low-bandgap III-V layer formed on a buffer layer, the etch is timed so that the trenches 42 terminate within the low-bandgap III-V layer. Directional reactive ion etching may be employed to remove the selected portions of the III-V layers. In one or more embodiments, the trenches have depths between one and five microns (1-5 μm) as measured from the top surface of the semi-insulating layer.

Trenches can be formed in semiconductor materials using photolithography and etching. For example, a hard mask can be deposited on the eDRAM portion of the substrate 28 followed by a photoresist layer. The photoresist layer is exposed to a pattern of radiation. The pattern is developed using a resist developer to provide an etch mask. The etch mask is then patterned to expose a portion of the hard mask that overlies the portion(s) of the substrate 28 in which the trenches are formed. The pattern is transferred to the hard mask using an anisotropic etch such as RIE. The resist can then be removed or remain on the substrate while the pattern is transferred to the III-V semiconductor layers 24, 26. Additional trenches 43 can be formed within the substrate 28 concurrently or at a different time than the capacitor trenches 42.

In some embodiments, the outer electrode or plate of the trench capacitor(s) is provided by the doped, low-bandgap III-V semiconductor material comprising the blanket layer 24. If this layer is undoped prior to trench formation, the outer electrode may be formed by diffusing or implanting n-type dopants therein. For example, the n-type dopants can be introduced by ion implantation into the trenches followed by an activation anneal. Alternatively, a layer of n-type doped material can be deposited in the trenches followed by annealing to drive the dopants into the regions of the blanket layer 24 adjoining the trenches.

A dielectric layer 44 is formed on the sidewalls and base of the trenches 42. In some embodiments, a high-k material having a dielectric constant exceeding 3.9 forms the dielectric layer, such as hafnium oxide or silicon nitride ($Si_3N_4$). Various techniques are known to the art for depositing dielectric materials. Atomic layer deposition (ALD), for example, is employed for depositing hafnium oxide. The dielectric layer 44 has a thickness between 3-5 nm in some embodiments.

An electrically conductive material is formed on the dielectric layer 44, filling the trenches 42 and forming the capacitor electrode 46. The electrically conductive material is metal in some embodiments and doped polysilicon in other embodiments. If polysilicon is deposited, phosphine, arsine or diborane are added to the silane from which the polysilicon is formed during LPCVD, depending on the doping type to be obtained. In an exemplary embodiment wherein the low bandgap III-V semiconductor material forming one of the capacitor plates is n-type, an n-type dopant is incorporated in the polysilicon. The doping level is about $5 \times 10^{18}$ $cm^{-3}$ in some embodiments. The trench capacitor 49 of each eDRAM device 36 in the exemplary structure 50 accordingly includes plates defined by the capacitor electrode 46 and the doped low bandgap III-V blanket layer and the dielectric layer 44 between the two plates. The trench capacitor 49 of each eDRAM 36 is electrically connected to one of the FETs 40 in the eDRAM region. The capacitor electrode 46 extends above the semi-insulating III-V semiconductor layer 26 in the exemplary structure 50 shown in FIG. 4 and electrically contacts a source/drain region of the associated FET 40. It will be appreciated that electrical communication between these elements can be obtained in other ways.

An electrically conductive contact 48 is formed in the trench 43. The contact may be comprised of nickel, palladium, or Pd/Si/Ti/Pt (ohmic contact) and is deposited using known techniques such as eBeam with masking, sputtering, or ALD. The contact 48 is in electrical communication with the portion of the blanket layer 24 forming the outer electrode of the capacitor portion 49 of the eDRAM device 36.

Those skilled in the art will appreciate that the exemplary structures discussed above can be distributed in raw form (a single wafer having multiple unpackaged chips), as bare dies, in packaged form, or incorporated as parts of intermediate products or end products that benefit from having eDRAM devices therein.

Given the discussion thus far, an exemplary fabrication method includes obtaining a structure 28 including a substrate 22, a first III-V semiconductor layer 24 on the substrate, the first III-V semiconductor layer including a low bandgap layer, and a semi-insulating III-V semiconductor layer 26 on the first III-V semiconductor layer. An exemplary structure is shown in FIG. 2 A plurality of first field effect transistors 30 is formed on a first region of the semi-insulating III-V semiconductor layer 26, each of the first field effect transistors including a channel region 32 containing III-V material. A plurality of second field effect transistors 40 is formed on a second region of the semi-insulating III-V semiconductor layer 26. The method further includes forming a plurality of trench capacitors 49 extending through the second region of the semi-insulating III-V semiconductor layer 26 and within the low bandgap layer of the first III-V semiconductor layer 24 such that each of the trench capacitors is in electrical communication with at least one of the second field effect transistors 40. The step of forming the plurality of trench capacitors may further include doping the first III-V semiconductor layer. Such doping can be in situ during formation of the first III-V semiconductor layer or subsequent to formation thereof. The step of obtaining the structure 28 may include obtaining the substrate 22, forming the first III-V semiconductor layer as a blanket layer 24 on the substrate, introducing dopants (for example, tellurium) within the low bandgap layer of the first III-V semiconductor layer during formation thereof, and forming the semi-insulating III-V semiconductor layer 26 directly on the first III-V semiconductor layer such that the semi-insulating layer adjoins the low bandgap layer. As discussed above, the low bandgap layer may comprise the entirety of the III-V semiconductor layer 24 or only the upper portion thereof in which the trench capacitors are formed. The method further includes forming a trench 43 through the semi-insulating III-V semiconductor layer and filling the trench with electrically conductive contact material in electrical communication with the first III-V semiconductor layer 24, such as shown schematically in FIG. 4. The step of forming the plurality of trench capacitors further includes forming a plurality of trenches 42 extending through the semi-insulating III-V semiconductor layer 26 and into the first III-V semiconductor layer 24 such that the low bandgap layer of the first III-V semiconductor layer 24 adjoins the trenches, forming a dielectric layer 44 within the trenches, and forming a capacitor electrode on the dielectric layer. Each of the capacitor electrodes 46 is in electrical communication with at least one of the second field effect transistors 40. In some embodiments, the low bandgap layer of the first III-V semiconductor layer 24 consists essentially of n-doped InGaAs or n-doped InAs. The first III-V semiconductor layer 24 further includes a III-V buffer layer between the substrate and the low bandgap layer in some embodiments. The substrate 22 may consist essentially of monocrystalline silicon. Alternatively, the substrate 22 includes germanium on monocrystalline silicon. In a further embodiment, the surface region of the substrate 22 consists essentially of a III-V compound semiconductor material.

An exemplary eDRAM structure includes a substrate 22 and a first III-V semiconductor layer 24 on the substrate, the first III-V semiconductor layer including a low bandgap layer. A semi-insulating III-V semiconductor layer 26 is on the first III-V semiconductor layer. A plurality of first field effect transistors 30 is on a first region of the semi-insulating III-V semiconductor layer, each of the first field effect transistors including a channel region containing III-V material. The structure further includes a plurality of second field effect transistors 30 on a second region of the semi-insulating III-V semiconductor layer 26. A plurality of trench capacitors 49 extends through the second region of the semi-insulating III-V semiconductor layer 26 and within the low bandgap layer of the first III-V semiconductor layer 24. Each of the trench capacitors includes a buried plate comprised of the low bandgap layer of the first III-V semiconductor layer, a capacitor electrode 46, and a dielectric layer 44 between the buried plate and capacitor electrode. Each of the capacitor electrodes is in electrical communication with at least one of the second field effect transistors 40. The semi-insulating III-V semiconductor layer 26 is operable to suppress parasitic leakage between each of the second field effect transistors 30 and each of the buried plates. As discussed above, the buried plates can be formed by doping the III-V low bandgap layer during formation thereof. Alternatively, the buried plates are formed by providing dopants subsequent to formation of the low bandgap layer, in which case the buried plates comprise doped regions surrounding the capacitor trenches 42. The low bandgap layer of the first III-V semiconductor layer 24 consists essentially of n-doped InGaAs or n-doped InAs in some embodiments.

A further eDRAM structure includes a substrate 22, a first III-V semiconductor layer 24 on the substrate, the first III-V semiconductor layer including a low bandgap layer, and a semi-insulating III-V semiconductor layer 26 on the first III-V semiconductor layer. An eDRAM structure including a trench capacitor 49 extends through the semi-insulating III-V semiconductor layer and within the low bandgap layer of the first III-V semiconductor layer. The eDRAM structure further includes a field effect transistor 40 on the semi-insulating III-V semiconductor layer. The trench capacitor includes a buried plate comprised of the low bandgap layer of the first III-V semiconductor layer, a capacitor electrode, and a dielectric layer 44 between the buried plate and capacitor electrode. The capacitor electrode is in electrical communication with the field effect transistor 40. The semi-insulating III-V semiconductor layer 26 is operable to suppress parasitic leakage between the field effect transistor and the buried plate. An electrically conductive contact 48 extends through the semi-insulating III-V semiconductor layer and electrically communicates with the buried plate. In some embodiments, the entirety of the low bandgap layer includes n-type dopants such as tellurium dopants.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
obtaining a structure including:
a substrate,
a first III-V semiconductor layer on the substrate, the first III-V semiconductor layer including a low bandgap layer, and
a semi-insulating III-V semiconductor layer on the first III-V semiconductor layer;
forming a plurality of first field effect transistors on a first region of the semi-insulating III-V semiconductor layer, each of the first field effect transistors including a channel region containing III-V material;
forming a plurality of second field effect transistors on a second region of the semi-insulating III-V semiconductor layer, and
forming a plurality of trench capacitors extending through the second region of the semi-insulating III-V semiconductor layer and within the low bandgap layer of the first III-V semiconductor layer such that each of the trench capacitors is in electrical communication with at least one of the second field effect transistors.

2. The method of claim 1, wherein the step of forming the plurality of trench capacitors further includes doping the first III-V semiconductor layer.

3. The method of claim 2, wherein the step of obtaining the structure includes:
obtaining the substrate;
forming the first III-V semiconductor layer as a blanket layer on the substrate;
introducing dopants within the low bandgap layer of the first III-V semiconductor layer during formation thereof, and
forming the semi-insulating III-V semiconductor layer on the first III-V semiconductor layer.

4. The method of claim 3, further including the step of forming a trench through the semi-insulating III-V semiconductor layer and filling the trench with electrically conductive contact material in electrical communication with the first III-V semiconductor layer.

5. The method of claim 3, wherein the step of forming the plurality of trench capacitors further includes forming a plurality of trenches extending through the semi-insulating III-V semiconductor layer and into the first III-V semiconductor layer such that the low bandgap layer of the first III-V semiconductor layer adjoins the trenches, forming a dielectric layer within the trenches, and forming a capacitor electrode on the dielectric layer.

6. The method of claim 5, wherein the capacitor electrodes and the second field effect transistors are formed such that each of the capacitor electrodes is in electrical communication with at least one of the second field effect transistors.

7. The method of claim 6, wherein the low bandgap layer of the first III-V semiconductor layer consists essentially of n-doped InGaAs or n-doped InAs.

8. The method of claim 7, wherein the first III-V semiconductor layer further includes a III-V buffer layer between the substrate and the low bandgap layer.

9. The method of claim 8, wherein the substrate consists essentially of monocrystalline silicon.

10. The method of claim 8 wherein the buffer layer on the silicon substrate includes GaAs and InP layers.

11. The method of claim 10, wherein the buffer layer is between 300 nm and 5000 nm thick.

12. An eDRAM structure comprising:
a substrate;
a first III-V semiconductor layer on the substrate, the first III-V semiconductor layer including a low bandgap layer;
a semi-insulating III-V semiconductor layer on the first III-V semiconductor layer;
a plurality of first field effect transistors on a first region of the semi-insulating III-V semiconductor layer, each of the first field effect transistors including a channel region containing III-V material;
a plurality of second field effect transistors on a second region of the semi-insulating III-V semiconductor layer, and
a plurality of trench capacitors extending through the second region of the semi-insulating III-V semiconductor layer and within the low bandgap layer of the first III-V semiconductor layer, each of the trench capacitors including a buried plate comprised of the low bandgap layer of the first III-V semiconductor layer, a capacitor electrode, and a dielectric layer between the buried plate and capacitor electrode, each of the capacitor electrodes being in electrical communication with at least one of the second field effect transistors, the semi-insulating III-V semiconductor layer being operable to suppress parasitic leakage between each of the second field effect transistors and each of the buried plate.

13. The eDRAM structure of claim 12, wherein the low bandgap layer of the first III-V semiconductor layer comprises one or more n-doped regions.

14. The eDRAM structure of claim 13, wherein the low bandgap layer of the first III-V semiconductor layer consists essentially of n-doped InGaAs or n-doped InAs.

15. The eDRAM structure of claim 14, wherein the substrate consists essentially of monocrystalline silicon, and wherein the first III-V semiconductor layer further includes a buffer layer between the substrate and the low bandgap layer.

16. The eDRAM structure of claim 15, further including an electrically conductive contact extending through the semi-insulating III-V semiconductor layer and electrically communicating with the buried plate.

17. The eDRAM structure of claim 16, wherein the semi-insulating III-V semiconductor layer has a thickness between 100 nm to 1000 nm.

18. An eDRAM structure comprising:
a substrate;
a first III-V semiconductor layer on the substrate, the first III-V semiconductor layer including a low bandgap layer;

a semi-insulating III-V semiconductor layer on the first III-V semiconductor layer;

an eDRAM structure including a trench capacitor extending through the semi-insulating III-V semiconductor layer and within the low bandgap layer of the first III-V semiconductor layer and a field effect transistor on the semi-insulating III-V semiconductor layer, the trench capacitor including a buried plate comprised of the low bandgap layer of the first III-V semiconductor layer, a capacitor electrode, and a dielectric layer between the buried plate and capacitor electrode, the capacitor electrode being in electrical communication with the field effect transistor, the semi-insulating III-V semiconductor layer being operable to suppress parasitic leakage between the field effect transistor and the buried plate, and an electrically conductive contact extending through the semi-insulating III-V semiconductor layer and electrically communicating with the buried plate.

19. The eDRAM structure of claim 18, wherein the field effect transistor includes a channel region consisting essentially of III-V material.

20. The structure of claim 19, wherein the substrate consists essentially of monocrystalline silicon.

* * * * *